(12) United States Patent
Kaneta et al.

(10) Patent No.: US 8,324,806 B2
(45) Date of Patent: Dec. 4, 2012

(54) ORGANIC EL ELEMENT WITH MULTI-STEP PARTITION WALL

(75) Inventors: Shingo Kaneta, Tokyo (JP); Ryo Shoda, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 13/075,106

(22) Filed: Mar. 29, 2011

(65) Prior Publication Data

US 2011/0241027 A1  Oct. 6, 2011

(30) Foreign Application Priority Data

Mar. 31, 2010 (JP) .................................. 2010-082258

(51) Int. Cl.
*H01L 33/16* (2010.01)
*H01L 51/40* (2006.01)
*H01L 51/30* (2006.01)

(52) U.S. Cl. ........ 313/504; 313/505; 313/507; 313/508; 445/24; 445/25; 257/E33.01

(58) Field of Classification Search .......... 313/498–512
See application file for complete search history.

(56) References Cited

U.S. PATENT DOCUMENTS

| | | | |
|---|---|---|---|
| 2003/0127657 A1* | 7/2003 | Park ................................ | 257/79 |
| 2005/0040754 A1* | 2/2005 | Sakurai ......................... | 313/500 |
| 2005/0236983 A1* | 10/2005 | Sakai et al. ................... | 313/506 |
| 2009/0230858 A1* | 9/2009 | Kobayashi .................... | 313/504 |
| 2010/0060153 A1* | 3/2010 | Uchida et al. ................. | 313/504 |

FOREIGN PATENT DOCUMENTS

| | | |
|---|---|---|
| JP | 05-234681 | 9/1993 |
| JP | 08-048858 | 2/1996 |
| JP | 2001-093668 | 4/2001 |
| JP | 2001-155858 | 6/2001 |
| JP | 2006-048980 | 2/2006 |
| JP | 2008-210653 | 9/2008 |

* cited by examiner

*Primary Examiner* — Tracie Y Green
(74) *Attorney, Agent, or Firm* — Squire Sanders (US) LLP

(57) ABSTRACT

One embodiment of the present invention is an organic EL element, including a substrate, a first electrode having a pixel region, the first electrode formed on the substrate, a multi-step partition wall, including a first partition wall formed on the substrate, the first partition wall sectioning the first substrate and having an inverse tapered shape, and a second partition wall formed on the first partition wall, the second partition wall having a bottom part which is narrower than a top part of the first partition wall, a light emitting medium layer, including a first light emitting medium layer formed on the pixel region, the first partition wall and the second partition wall, the first light emitting medium layer made of an inorganic material, and an organic light emitting layer on the first light emitting medium layer, and a second electrode formed on the light emitting medium layer, wherein the first light emitting medium layer is formed on the first electrode and the multi-layer partition wall.

18 Claims, 14 Drawing Sheets

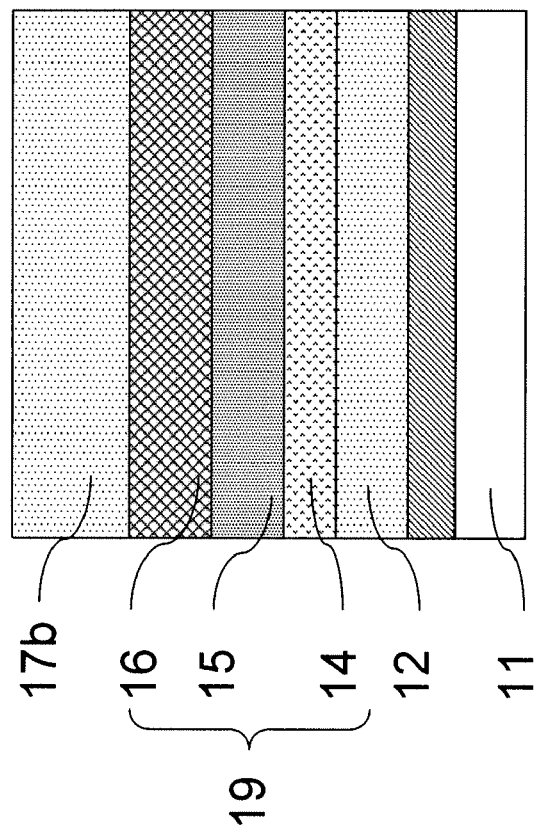

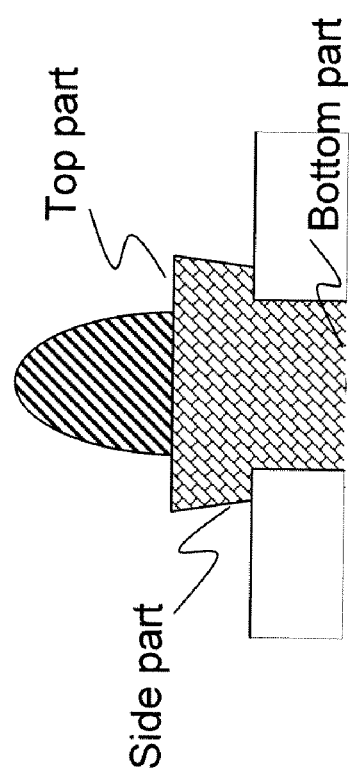

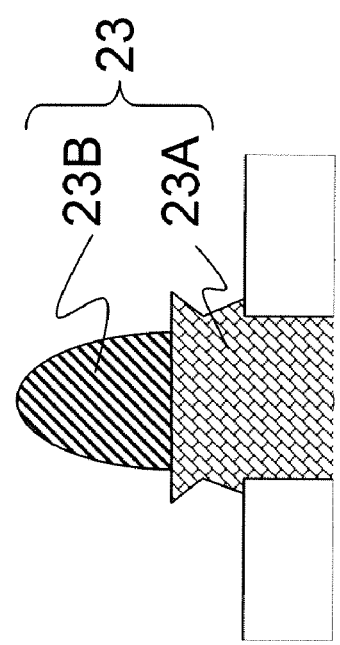

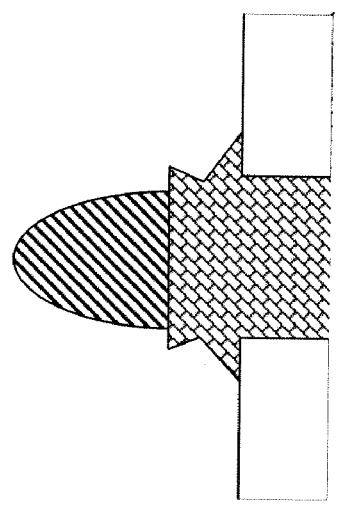

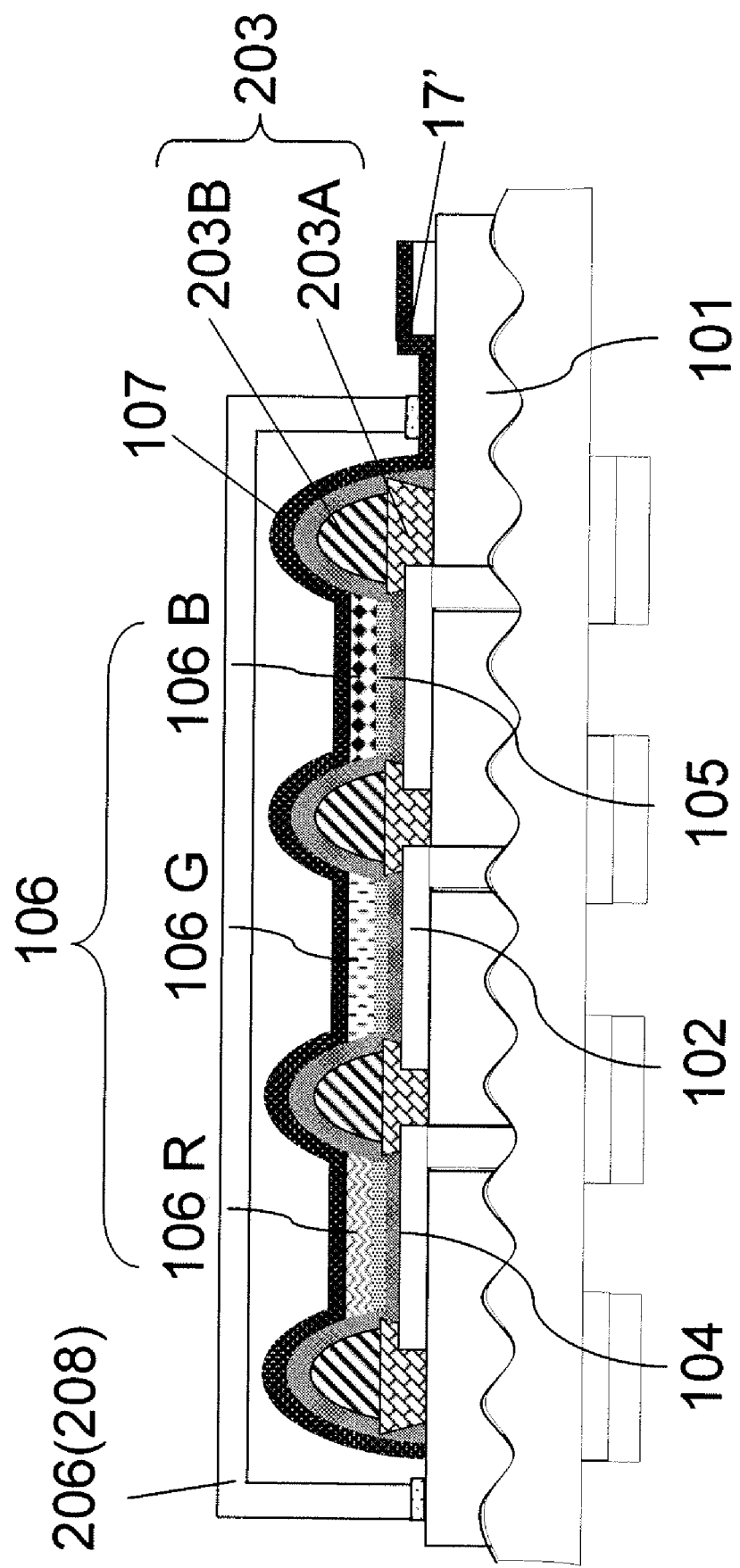

ORGANIC EL ELEMENT WITH MULTI-STEP PARTITION WALL

CROSS REFERENCE

This application is based upon and claims the benefit of priority from the prior Japanese Patent Application No. 2010-082258, filed on Mar. 31, 2010, the entire contents of which are incorporated herein by reference.

BACKGROUND OF THE INVENTION

1. Field of the Invention

The present invention is related to an organic EL (electroluminescence) element, an image display device and a method for manufacturing the organic EL element and the image display device.

2. Description of the Related Art

In recent years, the development of an organic EL element which is a light emitting element capable of emitting light with a high level of brightness by driving it using a DC low voltage is progressing. An organic EL element has a simple structure having two electrodes facing each other, a hole transport layer made of a hole transport material and an organic light emitting layer made of an organic light emitting material, the hole transport layer and the organic light emitting layer arranged between the two electrodes. When an electric current flows between the two electrodes in this organic EL element, the organic light emitting layer emits light and the emitted light passes through a transparent electrode.

In an organic EL element having this structure, both electrodes may be directly formed on both sides of the light emitting layer. However, in order to realize an increase of light emitting efficiency or the like, an injection layer or a transport layer or both is frequently arranged. In particular, a hole injection layer or a hole transport layer or both is arranged between an anode and a light emitting layer. Alternatively, an electron injection layer or an electron transport layer is arranged between a cathode and a light emitting layer. In an organic EL element, the entire structure body including the above plural layers between both electrodes is called a light emitting medium layer.

Types of an organic EL element are divided into an organic EL element using a low molecular organic light emitting material (hereinafter a low molecular organic EL element) and an organic EL element using a high molecular organic light emitting material (hereinafter a high molecular organic EL element).

In a method for forming a low molecular organic EL element, a thin film is generally formed by a dry coating method such as a vacuum deposition method. In a method for forming a low molecular organic EL element, if forming a pattern of a hole transport layer or an organic light emitting layer is required, a layer having a pattern corresponding to an opening part of a mask is formed using a metal mask or the like. However, in such a method for forming a pattern, if the size of a substrate becomes large, it is difficult to obtain accuracy in forming a pattern.

In a method for forming a high molecular organic EL element, the following method for forming a thin film is being attempted. A coating liquid in which an organic light emitting material is dissolved in a solvent is prepared, and the coating liquid is applied to a substrate by a wet coating method. As a wet coating method for forming a thin film, a spin coating method, a bar coating method, a lobe coating method and a dip coating method are well known. However, in the case where these wet coating methods are used, it is difficult to form a pattern of a thin film with a high definition or form a thin film by separately applying three colors of RGB. Therefore, in a method for forming a high molecular organic EL element, it is thought that it is most effective to form a thin film by a printing method which is capable of forming a pattern while a plurality of materials are separately applied.

Further, in an organic EL element or display, a glass substrate is frequently used as a substrate. Therefore, a method using a hard plate such as a printing plate made of a metal as a gravure printing method among various printing methods is not suitable for forming a high molecular organic EL element. On the other hand, an offset printing method using an elastic rubber blanket and a relief printing method using an elastic rubber plate or a light sensitive resin plate are suitable for a method for forming a high molecular organic EL element. In fact, a method by an offset printing method (Patent document 1) and a method by a relief printing method (Patent document 2) are presented.

In the case where an image display device is manufactured, multiple pixels are formed vertically and horizontally and light is emitted, and thereby an image is displayed. Therefore, a light emitting material, a hole injection material or the like is selectively arranged on a pixel electrode, and an organic EL element which is independently arranged for each pixel is formed. In this case, in general, a partition wall which sections respective pixels is arranged beforehand in order that a material is uniformly arranged in respective pixels and light is uniformly emitted.

In a high molecular organic EL element, a hole transport layer is arranged in order that light is emitted by a low applied voltage. A low molecular organic material and a high molecular organic material are usually used for a material of a hole transport layer as a light emitting layer. As a representative example of a low molecular hole transport material, TPD (triphenylamine system derivative: See Patent document 5) is known. As a representative example of a high molecular hole transport material, PEDOT:PSS (a mixture of polythiophene and polystyrene sulfonate: See Patent document 6) is known. A dry coating method and a wet coating method are used for a film formation method as an organic light emitting material.

A convex type structure (Patent document 3) and an inverse tapered structure (Patent document 4) are being examined as a partition wall structure used for a high molecular organic EL element. If a film thickness of a hole transport layer formed on an anode becomes thick, it is difficult for an electric charge to flow. Therefore, non-uniformity in light emitting occurs in an organic EL element which is a current injection type light emitting type. The purpose of the above trial is to control a film thickness of a pixel end (a partition wall end) in a wet coating method. However, in the case where a film thickness of a hole transport layer is thin or conductivity of a film is high, non-uniformity in emitted light does not occur.

Patent document 1: JP-A-2001-93668
Patent document 2: JP-A-2001-155858
Patent document 3: JP-A-2008-210653
Patent document 4: JP-A-2006-048980
Patent document 5: JP-B-2916098
Patent document 6: JP-B-2851185

In the case where conductivity is improved by a film thickness of a hole transport layer or improvement of a hole transport material, problems other than the above non-uniform light emitting occur. In the case where conductivity in a direction of a film thickness of a hole transport layer is called vertical conductivity and conductivity in a direction of a film surface of a hole transport layer (a direction parallel to a surface of a hole transport layer) is called horizontal conductivity, if vertical conductivity is lower than horizontal conductivity, normal light emitting due to an electric field is obtained. However, if conductivity of a film is low, the difference between vertical conductivity and horizontal conductivity becomes small and a current which does not contribute to light emitting (hereinafter called leak current) flows in the direction of a partition wall. A hole moves inside a hole transport layer formed above a partition wall and therefore characteristics of an organic EL element are reduced. In addition, in an image display device including such an organic EL element, if leak current flows between adjacent pixels, it is difficult to control a desirable display.

The present invention was made considering the above problem. A first purpose of the present invention is to provide an organic EL display device and a method for manufacturing the device in which manufacturing is easy and leak current can be reduced or controlled, in an organic EL display device in which a predetermined light emitting medium layer is formed on the entire display region including a part of a partition wall which sections pixels. In addition, a second purpose of the present invention is to provide an organic EL element, an image display device and a method for manufacturing an image display device in which leak current in a direction of a film surface of a hole transport layer is reduced and the element's characteristics are improved in an organic EL element having a hole transport layer.

SUMMARY OF THE INVENTION

In order to achieve the above object, an organic EL element of a first embodiment of the present invention is formed as follows. An organic EL element includes a substrate, a first electrode formed on the substrate, the first electrode sectioning a pixel region, a multi-step partition wall including a first partition wall formed on the substrate, the first partition wall sectioning the first electrode and having an inverse tapered shape and a second partition wall formed on the first partition wall, the second partition wall having a bottom part which is narrower than a top part of the first partition wall, a light emitting medium layer including a first light emitting medium layer formed on the pixel region, the first partition wall and the second partition wall, the first light emitting medium layer made of an inorganic material and an organic light emitting layer on the first light emitting medium layer, and a second electrode formed on the light emitting medium layer, wherein the first light emitting medium layer is formed on the first electrode and the multi-step partition wall. In an organic EL element of the first embodiment of the present invention, the first partition wall is preferably made of an inorganic insulating material. In an organic EL element of the first embodiment of the present invention, a film thickness of the first partition wall is preferably 50 nm-1000 nm. In an organic EL element of the first embodiment of the present invention, the second partition wall is preferably made of a light sensitive material. In an organic EL element of the first embodiment of the present invention, the organic EL element further includes a second light emitting medium layer made of an organic material, the second light emitting medium layer arranged between the first light emitting medium layer and the second electrode and covering the light emitting medium layer and the multi-step partition wall on the first electrode. In an organic EL element of the first embodiment of the present invention, a total film thickness of a first partition wall and a second partition wall is preferably 550 nm-5000 nm. In an organic EL element of the first embodiment of the present invention, the light emitting medium layer formed on the partition wall is preferably a hole transport layer. In an organic EL element of the first embodiment of the present invention, the hole transport layer is preferably made of an inorganic compound. In an organic EL element of the first embodiment of the present invention, the inorganic compound preferably includes one or more kinds of transition metals. In an organic EL element of the first embodiment of the present invention, the inorganic compound is preferably made of an oxide, a nitride or a sulfide. In an organic EL element of the first embodiment of the present invention, a film thickness of the light emitting medium layer is preferably smaller than a total film thickness of the first partition wall and the second partition wall.

In order to achieve the above object, an image display device of the second embodiment of the present invention includes the above organic EL element as a display element.

In order to achieve the above object, a method for manufacturing an organic EL image display element of a third embodiment of the present invention includes preparing a substrate, forming a first electrode on the substrate, forming a first partition wall having an inverse tapered shape, the first partition wall made of an inorganic material and sectioning the first electrode, forming a second partition wall made of a light sensitive material, the second partition wall having a bottom part which is narrower than a top part of the first partition wall, forming a light emitting medium layer including a hole transport layer and an organic light emitting layer, the hole transport layer formed on a region of the first electrode, the first partition wall and the second partition wall, and forming a second electrode facing the first electrode. In a method for manufacturing an organic EL image display element of the third embodiment of the present invention, a film thickness of the first partition wall is preferably 50 nm-1000 nm. In a method for manufacturing an organic EL image display element of the third embodiment of the present invention, a film thickness of the second partition wall is preferably 500 nm-5000 nm. In a method for manufacturing an organic EL image display element of the third embodiment of the present invention, at least one layer of the light emitting layer is preferably formed by a wet film forming method. In a method for manufacturing an organic EL image display element of the third embodiment of the present invention, it is preferable that the first electrode is a transparent electrode and the light emitting medium layer is formed between the first electrode and the second electrode. In a method for manufacturing an organic EL image display element of the third embodiment of the present invention, it is preferable that the second electrode is a transparent electrode and the light emitting medium layer is formed between the first electrode and the second electrode.

In order to achieve the above object, a method for manufacturing an image display device of a fourth embodiment of the present invention includes forming a display element using the method for manufacturing the organic EL element.

BRIEF DESCRIPTION OF THE DRAWINGS

FIG. 4(B) is a schematic cross sectional diagram showing a stacked structure of a top emission type organic EL element of the present invention.

FIG. 9 is a cross sectional diagram showing an organic EL display device related to the present invention.

50 . . . a display device (an organic EL element); 11, 101 . . . a substrate; 12, 102 . . . a first electrode (a pixel electrode); 14, 104 . . . a hole transport layer/a hole injection layer; 15, 105 . . . an interlayer; 16, 106 . . . a light emitting layer; 17, 107 . . . a second electrode (a cathode); 17a . . . a non-transparent second electrode; 17b . . . a transparent second electrode; 19 . . . a light emitting medium layer; 21, 210 . . . a resin layer; 50, 200 . . . an organic EL display device; 23, 203 . . . a partition wall (a multi-step partition wall); 23A, 203A . . . a first partition wall; 23B, 203B . . . a second partition wall; 28, 208 . . . a sealing body; 54 . . . a first light emitting medium layer; 55 . . . a second light emitting medium layer; 29 . . . a sealing plate; 31 . . . a reflection layer; 100 . . . an organic EL element; 700 . . . a relief printing machine; 701 . . . a stage; 702 . . . a substrate to be printed; 703 . . . an ink tank; 704 . . . an ink chamber; 705 . . . an anilox roll; 706 . . . a doctor; 707 . . . a relief printing plate; 708 . . . a printing cylinder; 709 . . . an ink layer.

DETAILED DESCRIPTION OF THE INVENTION

Hereinafter, embodiments of the present invention are explained using the figures. In addition, in respective figures used for the following explanations, scale sizes of respective components are appropriately changed in order that respective components can be recognized.

Figure 1:
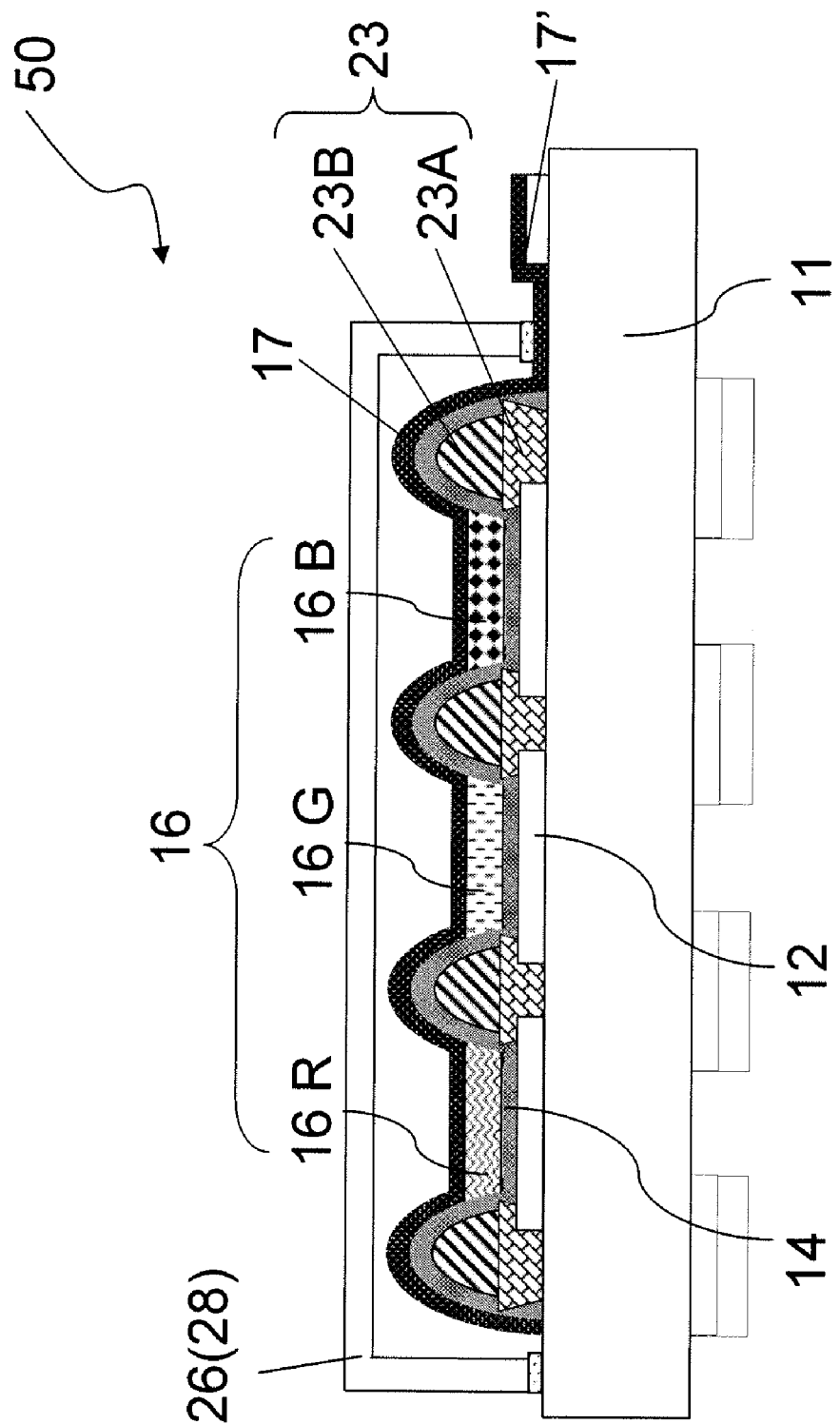
FIG. 1 is a schematic cross sectional diagram of an organic EL display device related to the present invention.

FIG. 1 is a cross sectional diagram showing a structure of an organic EL display device. A display device 50 using an organic EL element shown in FIG. 1 includes a substrate 11, a first electrode (an anode, a pixel electrode) 12, a first partition wall 23A, a second partition wall 23B, a hole transport layer 14, a light emitting layer 16, a second electrode (a cathode) 17, a light emitting medium layer 19 (see FIG. 4A) and a sealing body 28. The first electrode 12 is arranged for each pixel on the substrate 11. A partition wall 23 sections pixels of the first electrode 12. The hole transport layer 14 is formed above the first electrode 12. The light emitting layer is formed on the hole transport layer. The second electrode 17 is formed so as to cover the entire surface of the light emitting layer. The partition wall includes the first partition wall 23A and the second partition wall 23B. The light emitting layer 19 includes the hole transport layer 14 and the light emitting layer 16. The sealing body contacts the substrate 11 so that the sealing body 28 covers the second electrode 17. The sealing body 28 has a structure wherein a sealing cap 26 covering an organic EL element shown in FIG. 1 is used and an inert gas is enclosed inside the sealing cap 26.

Figure 2:
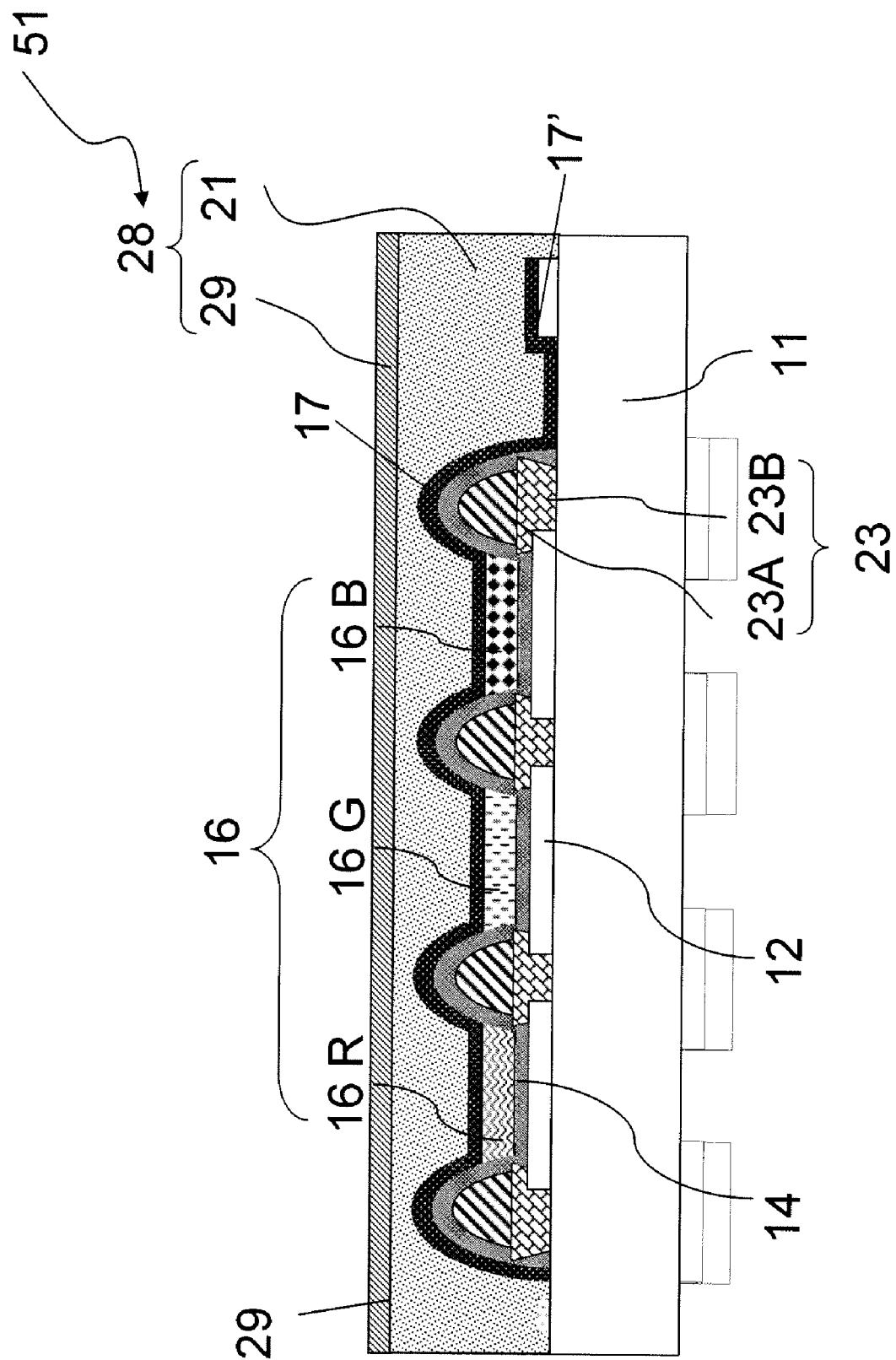
FIG. 2 is a schematic cross sectional diagram of an organic EL display device related to the present invention.

FIG. 2 is a cross sectional diagram showing a structure of an organic EL display device of a first embodiment of the present invention. A display device 51 using an organic EL element shown in FIG. 2 includes the electrode, the layer and the partition wall shown in FIG. 1. In the display device 51, a resin layer 21 is arranged so as to cover the second electrode, and the substrate 11 is attached to a sealing plate 29 through the resin layer. In FIG. 2, the resin layer 21 and the sealing plate 29 constitute a sealing body 28. In FIG. 1 and FIG. 2, a switching element (a thin film transistor) for controlling respective pixels is connected to the first electrode (not shown in the figures).

Figure 3:
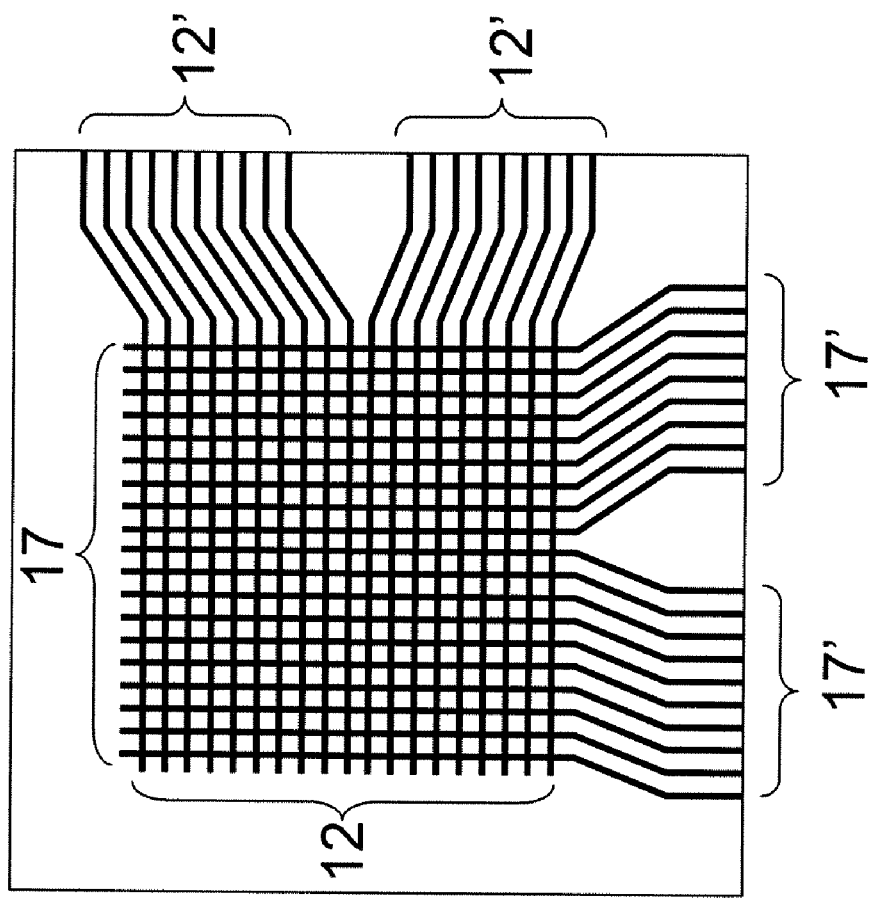
FIG. 3 is a schematic planar view showing a structure of an electrode of a passive type organic EL display device.

FIG. 3 is a schematic planar view of a constitution of an electrode of a passive type organic EL display device. In the present invention, the following structure may be adopted. A stripe shaped first electrode 12 intersects with a stripe shaped second electrode 17. A light emitting medium layer 19 is arranged between the first electrode 12 and the second electrode 17. That is, the structure of the present invention may be applied to a passive matrix type organic EL display device in which a pixel at a position of the intersecting part emits light.

In the following explanations, a region where the light emitting medium layer 19 is arranged between the first electrode 12 and the second electrode 17 is called "a light emitting region" or "an organic EL element". The entire array of an organic EL element including a partition wall 23 is called "a display region".

In FIGS. 1-3, the light emitting layer 19 is a layer sandwiched between the first electrode (an anode) 12 and the second electrode (a cathode) 17. In the structure shown in FIG. 1, the hole transport layer 14 and the light emitting layer 15 correspond to the light emitting medium layer 19. In addition to this, a hole injection layer, an electron transport layer, and an electron injection layer or the like may be appropriately added.

For example, in the structure shown in FIG. 1, the light emitting medium layer 19 is comprised of two layers of the light emitting layer 16 and a hole transport layer on the transparent electrode (an anode) 12. However, the light emitting medium layer 19 may be comprised of two layers of a hole injection layer and the light emitting layer 16. In addition, a light emitting medium layer may be comprised of a hole injection layer, the hole transport layer 14 and the light emitting layer 16. In addition, one layer may play respective roles of the above plurality of layers. For example, in the light emitting medium layer 19, the light emitting medium layer 16 may have a hole transport function. In addition, the light emitting medium layer 19 may be comprised of a hole injection layer and an electron transport layer, and an interface between the hole injection layer and the electron transport layer may emit light. If a layer exists between electrodes and the layer makes a carrier (a hole, an electron) move between the electrodes, the layer is a light emitting medium layer.

A film thickness of the entire light emitting layer 19 is equal to or less than 1000 nm, more preferably 50-300 nm in the case where the light emitting layer 19 is comprised of a single layer of a light emitting layer and the case where the light emitting layer 19 has a multi-layer structure.

In the organic EL display device shown in FIGS. 1 and 2, pattern-shaped light emitting layers 16R, 16G and 16B which correspond to light emitting wavelengths of red (R), green (G) and blue (B) are respectively formed for each pattern-shaped electrode. In this way, a display panel capable of a full-color display is realized. As a type other than such a display type, a pigment conversion type using a blue light emitting layer and a pigment conversion layer may be used. In addition, a structure in which a color filter is arranged so as to correspond to each of the organic EL elements which emit white light may be adopted.

Figure 4A:
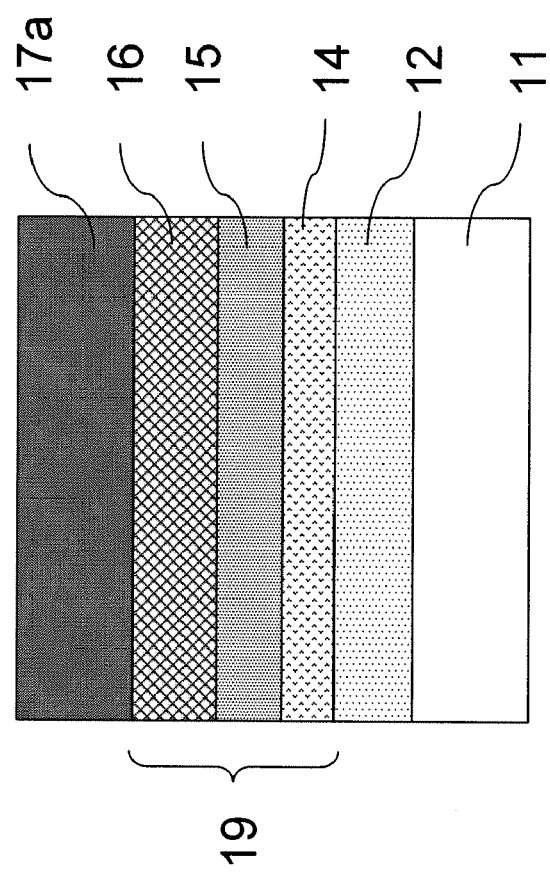
FIG. 4(A) is a schematic cross sectional diagram showing a stacked structure of a bottom emission type organic EL element of the present invention.

FIGS. 4A and 4B are cross sectional diagrams showing a stacked part (a light emitting region) of an organic EL element of the present invention. FIG. 4A shows a bottom emission type organic EL element, and shows a structure in which a first electrode 12, a light emitting medium layer 19 and a second electrode 17a are formed on a substrate 11, wherein the first electrode 12, the light emitting medium layer 19 and the second electrode 17a are arranged in this order. In a structure of the light emitting medium layer 19 in which the first electrode 12, the light emitting medium layer 19 and the second electrode 17a are arranged in this order, an interlayer 15 or other light emitting medium layer in addition to a hole transport layer 14 and a light emitting layer 16 may be arranged between respective layers. The second electrode 17a is a non-transparent electrode. When a material such as a metal having a high reflectance is used as a material of the second electrode 17a, light emitting toward the second electrode 17a is reflected by the second electrode 17a and thereby emitted light can be emitted to the exterior of an organic EL element through the first electrode 12 which is a transparent electrode.

FIG. 4B is a top emission type organic EL element in which a reflection layer 31, the first electrode 12, the hole transport layer 14, the interlayer 15, the light emitting layer 16 and the second electrode are arranged in this order on the substrate 11. In the structure of the light emitting medium layer 19 in which these layers are arranged in this order, other layers may be arranged between a plurality of layers. The second electrode 17b is a transparent electrode. Light emitted toward the first electrode 12 passes through the first electrode 12 and is reflected by the reflection layer and thereby is emitted to the exterior of an organic EL element through the second electrode 17b. On the other hand, light emitted toward the second electrode 17b similarly is emitted to the exterior of an organic EL element through the second electrode. In the following explanations, embodiments are explained using a bottom emission type organic EL element as an example. However, a structure of the embodiments can apply to a top emission type in which a transparent conductive film is used as a material of a second electrode 17b.

Figure 5C:
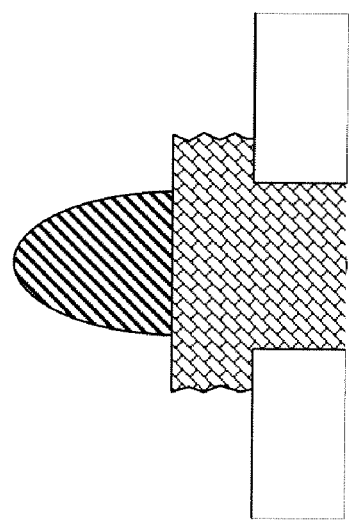
FIG. 5 is a schematic cross sectional diagram showing a two layer structure partition wall in an organic EL display device of the present invention.
Figure 6A:
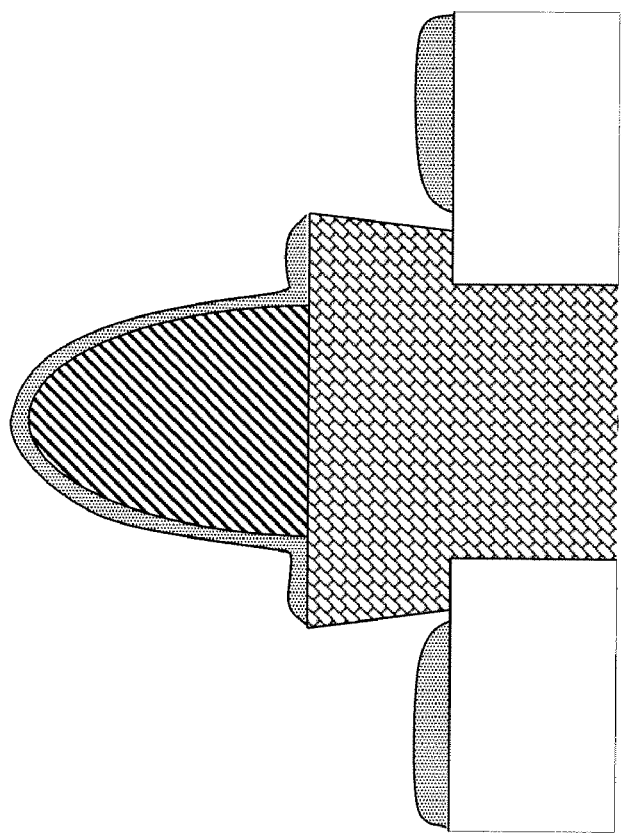
FIGS. 6 (A) and (B) are schematic diagrams showing a film formation process of a light emitting medium layer in an organic EL display device of the present invention.
Figure 6B:
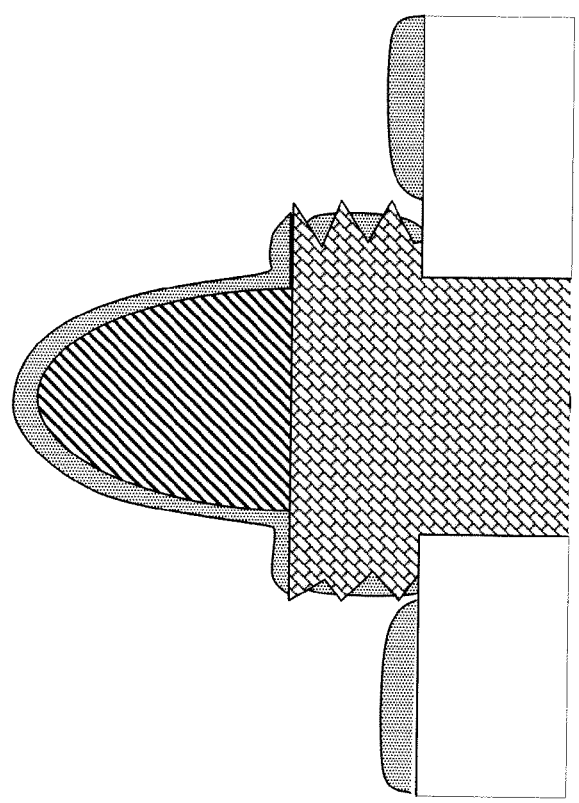

Respective components and a manufacturing method of the present invention of a partition wall 23 formed on a first electrode 12 are explained. In an organic EL display device of the present invention, as shown in FIG. 5, a partition wall is a multi-step partition wall having a two layer structure including a first partition wall 23A and a second partition wall 23B. As described later, when a predetermined light emitting medium layer is provided on this partition wall 23, the light emitting medium layer is partially divided by an inverse tapered part of a first partition wall. Therefore, a hole part is partially formed in a light emitting medium layer. Thereby, movement of an electrical charge in a light emitting medium layer is limited, and a leak current can be controlled. In addition, the phrase "a hole part is partially formed in a light emitting medium layer" includes a state where a film thickness of a part of a light emitting medium layer formed on the first partition wall 23A is thin, or a state where a light emitting medium layer is noncontinuously distributed in a cross sectional view of the partition wall 23 as shown in FIG. 6A. In addition, a light emitting medium layer which is formed along an inverse tapered shape of the partition wall 23 as shown in FIG. 6B is respectively formed on a concave part and a convex part of the first partition wall 23A. A light emitting medium layer formed in this way constitutes a concave and a convex film. Therefore, the phrase "a hole part is partially formed in a light emitting medium layer" includes a state where a light emitting medium layer is partially insulated due to a step between a concave part and a convex part. In addition, as described later, for example, in the case where a light emitting medium layer is formed on the partition wall 23 by a gaseous film forming method such as a evaporation method, a material of a light emitting medium layer is formed on an exposed part which is exposed to an evaporation source, and a material of a light emitting medium layer is not formed on a non-exposed part (for example, a shaded part due to an inverse tapered part) which is not exposed to an evaporation source. In particular, a material of a light emitting medium layer does not reach a slope surface of the first partition wall 23A which is a shaded part due to an inverse tapered part. Therefore, a light emitting medium layer formed on the first partition wall 23A is partially divided by an inverse tapered part.

In the present invention, in the case where a light emitting medium layer (a first light emitting medium layer) formed by a gaseous film formation method such as the vaporization method stated above is made of an inorganic material, remarkable effects are obtained. In the case of an inorganic light emitting medium layer, since specific resistance is small, influence of a leak current is large. However, in the present invention, a first light emitting medium layer is partially divided by an inverse tapered part of a first partition wall and thereby leak current can be reduced. In addition to this, since an inorganic light emitting medium layer is made of an inorganic material, conductivity is high and an organic EL element emitting light can be made uniformly.

Figure 7:
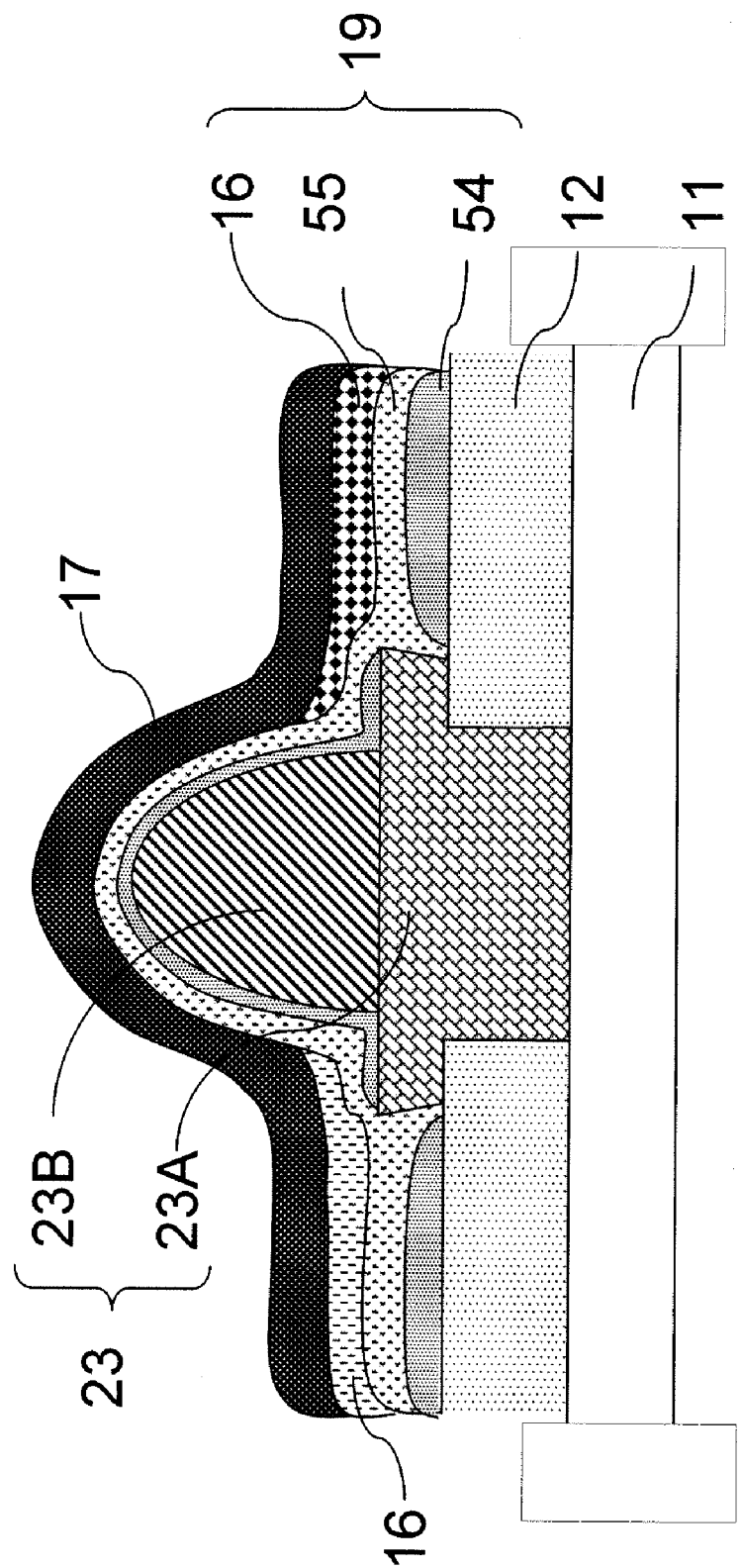
FIG. 7 is a schematic diagram showing a structure of a light emitting medium layer and a partition wall related to the present invention.

FIG. 7 is a schematic diagram showing the structure of the light emitting medium layer 19 and partition walls 23A and 23B in the present invention. A light emitting medium layer 54 (a first light emitting medium layer) formed on the first partition wall 23A, the second partition wall 23B and the first electrode 12 is not especially limited, but is preferably a layer formed directly on a surface of the partition wall 23. This is because an effect when the layer is divided by a partition wall is remarkable and leak current can be reduced with certainty. Therefore, specifically, a hole transport layer (a hole injection layer) is preferable. In addition, it is not necessary that the light emitting medium layer 54 be a single layer. For example, a continuous hole transport layer and an continuous interlayer on the hole transport layer are made of an inorganic material, and each light emitting medium layer is divided by the first partition wall 23A. In such a case, the structure comprised of a plurality of stacked layers is equivalent to the first light emitting medium layer 54.

Further, it is preferable that a second light emitting medium layer 55 made of an organic material is arranged on the first light emitting medium layer 54 so as to cover a partition wall including the first partition wall 23A and the second partition wall 23B and a light emitting medium layer. If the entire surface of a partition wall and a pixel region is covered, division of the second electrode 17 by the first partition wall 23A can be controlled that. Especially, if a high molecular organic material is used, the effect of covering is remarkable. In addition, if an application method is used as a forming method, a hole part of the first light emitting medium layer 54 is easily covered by leveling of an ink. Examples of a second light emitting medium layer 55 covering the entire surface of a display region include an interlayer between a hole transport layer and a light emitting layer or an electron transport layer formed above a light emitting layer. In particular, in the case where an interlayer between a hole transport layer and a light emitting layer is used as the second light emitting medium layer 55, if the light emitting layer 16 is formed by a printing method as described later, an interlayer plays the role of an underlayer. Thereby flatness of the light emitting layer 16 can be preferably improved.

In the case where the light emitting medium layer 19 is formed on a surface of the partition wall 23, an average film thickness (hereinafter, simply called a film thickness) of the light emitting medium layer 19 at a light emitting region is preferably 1 nm-500 nm, and more preferably 300 nm or less. In the case where a film thickness is less than 1 nm or more than 300 nm, a function of the light emitting medium layer 19 can not be obtained and emitted light intensity of an EL element is reduced.

Hereinafter, specific materials and forming methods used in an organic EL element related to the present invention are explained.

A material of substrate 11 is, for example, glass, quartz, a plastic film or sheet of polypropylene, polyether sulfone, polycarbonate, cyclo-olefin polymers, polyalylate, polyamide, polymethyl methacrylate, polyethylene terephthalate and polyethylenenaphthalate. In the case of a top emission type organic light emitting electric field element, in addition to the above materials, the following materials can be used: a transparent substrate which is the above plastic film or sheet with a single layer or a plurality of layers of metallic oxide such as silicon oxide and aluminium oxide, metal fluoride such as aluminum fluoride and magnesium fluoride, metal nitride such as silicon nitride and aluminum nitride, metal oxynitride such as silicon oxide nitride, or macromolecular resin film such as acrylic resin, epoxy resin, silicone resin and polyester resin; and a opaque substrate such as a metal foil, sheet or plate of aluminum or stainless, or a plastic film or sheet with a metal film such as aluminum, copper, nickel or stainless.

In the case where an organic EL display device 50 is a bottom emission type, light emitted from the light emitting medium layer 19 passes through an electrode adjacent to substrate 11 and is extracted to the exterior of the organic EL display device 50. On the other hand, in the case of a top emission type, emitted light passes through an electrode facing the substrate 11 and is extracted to the exterior. It is preferable that the substrate 11 made of the above material is subjected beforehand to a moisture prevention process or a hydrophobic treatment. For example, an inorganic film is formed on the entire surface or one surface of the substrate 11. Alternatively, a resin is applied. In particular, it is preferable that moisture content, moisture passing rate and gas passing rate of the substrate 11 is small, in order that moisture entering into the light emitting medium layer 19 is prevented.

A first electrode 12 related to the first embodiment of the present invention is formed on the substrate 11 as a film. If necessary, a pattern of the film is formed. The first electrode 12 is sectioned by the partition wall 23 and is a pixel electrode corresponding to each pixel (subpixel).

A material of the first electrode 12 is described below: a metal complex oxide such as ITO (indium tin complex oxide), IZO (indium zinc complex oxide) or AZO (zinc aluminium complex oxide); metallic substances such as gold and platinum; and the particle dispersion membrane which finely disperses particles of the metallic oxide or the metallic substance is dispersed in epoxy resin or acrylic resin. A structure of the first electrode 12 is a single layer structure or a stacked layer structure. The first electrode 12 can also be formed by coating a precursor such as indium octylate or acetone indium on the substrate, followed by an application thermal decomposition method in which oxide is formed by thermal decomposition.

In the case where the first electrode 12 is an anode, it is preferable that a material having a high work function such as ITO is selected. In an organic EL display device of active matrix driving, a material of the first electrode 12 is preferably a material of low resistance. For example, a material having a sheet resistance of equal to or lower than 20 ohm/square can be preferably used as a material of the first electrode 12.

The following methods can be used depending on material as a formation method of the first electrode 12: a dry method such as resistance heating evaporation method, electron-beam evaporation technique, reactivity evaporation method, ion plating method and sputtering method; and a wet method such as ink-jet printing, gravure process and screen printing. In addition, a formation method of the first electrode 12 is not limited to the above methods, and other methods can be used. In addition, a taking-out electrode (not shown in the figures) which is formed on the periphery of a substrate 11 and is connected to the first electrode 12 can be formed in the same process using the same material.

According to a material and a film formation method, existing patterning method such as mask evaporation method, photolithography method, wet etching method and dry etching method can be used as a patterning method of the first electrode 12. In addition, if necessary, a surface of the first electrode 12 may be activated by UV processing, plasma processing or the like.

In the case of a top emission type, a reflection layer 31 (See FIGS. 4A and 4B) is preferably formed under the first electrode 12. A material of high reflectance is preferably used as a material of the reflection layer. For example, Cr, Mo, Al, Ag, Ta, Cu, Ti and Ni are adopted. In addition, the following structure is adopted as a structure of the reflection layer. A protective film of SiO, $SiO_2$, $TiO_2$ or the like is formed on a single film, a stacked layer film, an alloy film which includes one or more kinds of the above materials (Cr, Mo, Al, Ag, Ta, Cu, Ti and Ni), or a film comprised of the above materials (Cr, Mo, Al, Ag, Ta, Cu, Ti and Ni). It is preferable that the average reflectance of the entire region of visible light wave length is 80% or more, and if the value is more than 90%, a reflection layer can be preferably used.

The following methods can be used depending on material as a formation method of a reflection layer: a dry method such as resistance heating evaporation method, electron-beam evaporation technique, reactivity evaporation method, ion plating method and sputtering method; and a wet method such as ink-jet printing, gravure process and screen printing. In addition, a formation method of a reflection layer is not limited to the above methods, and other methods can be used.

For a patterning method of a reflection layer, according to a material and a film formation method, existing patterning methods such as a mask evaporation method, photolithography method, wet etching method and dry etching method can be used.

In the present invention, the partition wall 23 is formed so as to section a light emitting region corresponding to respective pixels. The partition wall 23 functions as a sectioning component which sections respective parts of a plurality of pixels. In the case where a light emitting medium layer is arranged in respective pixels by a method for forming a pattern using a wet coating method, since the partition wall 23 is arranged as mentioned above, a color mixture between adjacent pixels can be prevented. In addition, the partition wall 23 has a two layer structure including the first partition wall 23A having an inverse tapered part and the second partition wall 23B having a tapered part, and thereby a leak current in a light emitting medium layer formed on the entire surface of a display regions is reduced. This is described later.

It is preferable that the partition wall 23 is formed so as to cover an end of the first electrode 12. In general, in an organic EL display device 50 of an active matrix driving type, the first electrode 12 is formed for each pixel. In order to make an area of each pixel as large as possible, an area where a pixel region of the first electrode 12 is exposed is made large. Therefore, the partition wall 23 is formed so as to cover an end part of the first electrode 12. The most preferable planar shape of a partition wall is a lattice shape. A partition wall is arranged between pixel electrodes 12 so as to section adjacent pixel electrodes 12

A commercially available material may be used for an inorganic insulating material of the first partition wall 23A. Examples of the first partition wall 23A include inorganic oxides such as silicon oxide, tin oxide, aluminum oxide and titanium oxide, inorganic nitrides such as silicon nitride, titanium nitride and molybdenum nitride, inorganic nitrided oxide film such as nitrided silicon oxide. However, usable materials are not limited to these. The most suitable material of these inorganic insulating films is silicon nitride, silicon oxide or titanium oxide. In addition, in the present invention, usable materials are not limited to the above materials and other materials may be used. In addition, in order to improve display quality of an organic EL element, the above inorganic insulating materials include a material having a light shielding property. In addition, a film of the material having a light shielding property may be formed on a bottom part, a top part and a side part.

An inorganic insulating material for forming the first partition wall 23A can be formed by a dry coating method such as a sputtering method, a plasma CVD method and a resistance heating evaporation method. In addition, an ink including an inorganic insulating material is applied by a well known application method such as a spin coater, a bar coater, a roll coater, a die coater and a gravure coater. Thereafter, a baking process such as atmospheric drying or heat drying is performed, thereby a solvent is removed and an inorganic insulating film can be obtained. Next, a photosensitive resin is applied to the inorganic insulating film, and exposure and development are performed, thereby a pattern is formed. A positive resist or a negative resist can be used for a photosensitive resin. A commercially available resist can be used. A method for forming a predetermined pattern using photolithography can be exemplified as a process for forming a pattern. In addition, in the present invention, usable methods are not limited to the above methods, and other methods can be used. If necessary, an inorganic insulating film may be subjected to plasma irradiation or UV irradiation.

A dry etching method such as reactive ion beam etching, reactive gas etching and reactive ion etching can be used for forming an inverse tapered structure of the first partition wall 23A. In addition, wet etching using a liquid capable of being dissolved by decomposition can be used. However, dry etching is more preferable than wet etching. Wet etching is isotropic etching and dry etching is anisotropic etching which can easily and selectively form a shape of a side surface.

A material such as silicon oxide has conductivity depending on a film thickness of the material. Therefore, a film thickness of the first partition wall 23A is preferably 50 nm-1000 nm in order to obtain an insulating property. More preferably, a film thickness is 150 nm or less. In the case where the first partition wall 23A does not have sufficient insulating properties, current flows through the first partition wall 23A between adjacent pixel electrodes 12. This becomes a leak current and display failure occurs.

A light sensitive material can be used as formation material of the second partition wall 23B. Both a positive type resist and a negative type resist can be used. A commercial material can be used. A formation material of the partition wall has to have sufficient insulating properties. When the second partition wall 23B does not have enough insulating properties, adjacent electrodes short-circuit through the second partition wall 23B. Therefore, display defects occur. By way of example only, materials such as polyimide system, an acryl resin system, a novolak resin system or a fluorene system can be used for a material of the second partition wall 23B. However, the usable material is not limited to these materials. In addition, light shielding materials may be included in the above light sensitive materials for the purpose of improving display quality of an organic EL element.

A light sensitive resin for forming the second partition wall 23B is applied by a well known application method such as a spin coater, a bar coater, a roll coater, a die coater and a gravure coater. Next, in an exposure process using a mask, a pattern of a light sensitive resin is formed. An exposed light sensitive resin was developed and thereby a pattern of the second partition wall 23B is formed. As described above, as a process for forming a pattern of the second partition wall 23B, a conventional well known exposure and developing method is used. In a burning process, the second partition wall 23B can be burned using a conventional well known method using an oven, a hot plate or the like.

For example, a method for forming a pattern of the second partition wall 23B is a method in which a light sensitive resin is applied to the substrate 11 and a predetermined pattern is obtained by a photolithography method. A bottom part of the second partition wall 23B can be easily formed so as to have a width narrower than a width of a top part of the first partition wall 23A by a photolithography method and thereby a photolithography method can be preferably used. In addition, in the present invention, a usable method is not limited to the above method. As long as a bottom part of the second partition wall 23B can be formed so as to have a width narrower than a width of a top part of the first partition wall 23A, other methods may be used. If necessary, a resist and a light sensitive resin may be subjected to a surface process such as a plasma irradiation or a UV irradiation.

It is preferable that a film thickness of the second partition wall 23B is 500 nm-5000 nm. If a height (a film thickness) of the second partition wall 23B is too low, in the case where the light emitting medium layer 19 is thick, short-circuits may not be prevented. In addition, if a height (a film thickness) of the second partition wall 23B is too high, a steep step surface may be formed by the second partition wall 23B, and it is difficult to form a counter electrode (a cathode, a second electrode) 17 on this step surface. In the case where the counter electrode (a cathode, a second electrode) 17 is broken due to this step surface, display failure occurs. In addition, in the case of a partition wall of a film thickness within the range stated above, when a light emitting medium layer is formed by a printing method, spreading of a light emitting medium layer ink which is printed on respective pixel electrodes 12 can be controlled.

In order to wash a surface of a first electrode (an anode) and adjust a work function of an anode is after a partition wall is formed, as pre-process of the substrate, UV processing, plasma processing or the like may be performed. In order that a hole is effectively injected into a light emitting medium layer, it is preferable that work function of a surface of an anode contacting a light emitting medium layer is near a work function of a light emitting medium layer. Therefore, it is preferable that a difference between a work function of a surface of an anode which is subjected to a surface processing and a work function of a light emitting medium layer contacting an anode is 0.5 eV or less, more preferable 0.2 eV or less.

In the case where ITO is used as a first electrode, a work function thereof before surface processing is about 4.8 eV. On the other hand, in the case where a hole transport layer or a hole injection layer is formed on an anode as a light emitting medium layer as described later, for example, a work function of molybdenum oxide is about 5.8 eV. Therefore, before surface processing, a difference between a work function of an anode and a work function of a hole transport layer is too large. Therefore, a hole injection barrier becomes high and it is difficult for a hole to be injected. Therefore, a work function of an anode is increased by surface processing and a difference between a work function of an anode and a work function of a hole transport layer is made smaller.

In addition, as a light source for UV processing, a low-pressure mercury lamp, a high-pressure mercury lamp, an excimer lamp or the like are used. In the present invention, any light sources can be used. In the case where oxygen plasma processing is performed, if power, pressure and time for irradiating with plasma are adjusted, a work function of an anode can be controlled so as to have a desirable value. In addition, in the case where oxygen plasma processing is performed, an anode is subjected to surface processing while the partition wall 23 is slightly etched. Therefore, in surface processing of an anode, it is necessary that its processing condition is adjusted considering the etching effect of the partition wall 23.

A surface of a first electrode which is subjected to surface processing recovers due to time-dependent change. Therefore, surface processing of an anode is preferable performed just before a hole transport layer 14 is formed.

Next, a hole injection layer is a layer having a function in which a hole is injected from a transparent electrode (an anode). A hole transport layer is a layer having a function in which a hole is transported to a light emitting layer. These layers may have both a hole injection function and a hole transport function. In this case, according to the levels of these functions, a function layer is called one of the names or both of the names. In respective embodiments of the present invention, a layer which is called a hole transport layer also includes a hole injection layer.

In order that a hole is effectively injected from a hole transport layer 14 to a light emitting medium layer (for example, an interlayer) which is formed on the hole transport layer 14, as material properties of the hole transport layer 14, it is preferable that a work function of the hole transport layer 14 is equal to or more than a work function of an anode (the first electrode 12). Suitable material properties of a hole transport layer 14 are different depending on the material selected for an anode. However, the hole transport layer 14 having a work function of 5.0 eV-6.0 eV can be used. In the case where an anode is ITO or IZO, the hole transport layer 14 having a work function of 5.0 eV-6.0 eV can be preferably used. In addition, in the case of a bottom emission structure, because emitted light passes through the first electrode 12 to the exterior, the extracted emitted light is reduced in the case where optical transparency of the hole transport layer 14 is low. Therefore, an average optical transparency of the hole transport layer 14 is preferably 75% or more in a visible light wavelength region, and more preferably 85% or more.

For example, a material of such a hole transport layer is a polymer material such as polyaniline, polythiophene, polyvinyl carbazole and a mixture of poly (3,4-ethylenedioxythiophene) and polystyrene sulfonic acid. In addition to these, a conductive polymer having electrical conductivity of $10^{-2}$-$10^{-6}$ S/cm can be preferably used. A polymer material can be used for a film formation process by a wet method. Therefore, in the case where a hole injection layer or a hole transport layer is formed, a polymer material is preferably used. Such a polymer material is dispersed or dissolved in water or solvent, and is used as a dispersion liquid or a solution. In addition, in the case where an inorganic material is used as a hole transport material, $Cu_2O$, $Cr_2O_3$, $Mn_2O_3$, $FeO_x$ ($x \geqq 0.1$), NiO, COO, $Bi_2O_3$, $SnO_2$, $ThO_2$, $Nb_2O_5$, $Pr_2O_3$, $Ag_2O$, $MoO_2$, ZnO, $TiO_2$, $V_2O_5$, $Nb_2O_5$, $Ta_2O_5$, $MoO_3$, $WO_3$, $MnO_2$ or the like can be used.

A method for forming the hole transport layer 14 is as follows. A hole transport layer is formed at once on the entire surface of a display region on the substrate 11 by a simple method such as a spin coat method, a die coat method, a dipping method, a slit coat method or the like. In the case where the hole transport layer 14 is formed, an ink (a liquid material) in which the hole transport material is dissolved in water, an organic solvent or a mixture solvent thereof is used. As an organic solvent, toluene, xylene, anisole, mesitylene, tetralin, acetone, methyl ethyl ketone, methyl isobutyl ketone, cyclohexanone, methanol, ethanol, isopropyl alcohol, ethyl acetate, butyl acetate or the like can be used. In addition, a surfactant, an antioxidant, a viscosity modifier, an ultraviolet absorber or the like can be added to the ink. In the case where the hole transport layer 14 is made of an inorganic material, the hole transport layer 14 can be formed using a dry process such as resistance heating vapor deposition method, electron-beam evaporation technique, reactive evaporation method, ion plating method and sputtering method.

It is preferable that an interlayer 15 is arranged between an organic light emitting layer and a hole transport layer as an electron blocking layer. Fluorescence life time can be improved. In the case of an element structure of a top emission type, after the hole transport layer 14 is formed, the interlayer 15 can be formed on the hole transport layer 14. The interlayer 15 is usually formed so as to cover a hole transport layer. However, if necessary, an interlayer may be formed by forming a pattern.

As an organic material of the interlayer 15, polyvinylcarbazole, derivative of polyvinylcarbazole, polymers including aromatic amine such as polyarylene derivative having aromatic amine at a main chain or a side chain, aryl amine derivative and triphenyl diamine derivative can be exemplified. As an inorganic material of the interlayer 15, an inorganic compound including one or more kinds of transition metal oxides such as $Cu_2O$, $Cr_2O_3$, $Mn_2O_3$, NiO, COO, $Pr_2O_3$, $Ag_2O$, $MoO_2$, ZnO, $TiO_2$, $V_2O_5$, $Nb_2O_5$, $Ta_2O_5$, $MoO_3$, $WO_3$ and $MnO_2$, nitrides thereof and sulfide thereof can be exemplified. In addition, in the present invention, usable materials are not limited to these, and other materials can be used.

An organic material of the interlayer 15 is dissolved in a solvent or is stably dispersed in a solvent, and this is used as an organic interlayer ink (a liquid material of an organic interlayer). A solvent which dissolves or disperses a material of an organic interlayer is toluene, xylene, acetone, anisole, methyl ethyl ketone, methyl isobutyl ketone and cyclohexanone single solvent or a mixed solvent). Above all, aromatic organic solvents such as toluene, xylene and anisole are preferably used in view of solubility of an organic interlayer material. In addition, a surfactant, an antioxidant, a viscosity modifier and an ultraviolet absorber can be added to an organic interlayer ink, if necessary.

It is preferable that a material having a work function equal to or more than a work function of the hole transport layer 14 is selected as a material of an interlayer. Further, it is more preferable that a material having a work function equal to or less than a work function of the organic light emitting layer 16 is selected as a material of an interlayer. This is because an unnecessary injection barrier in the case where a carrier is injected from the hole transport layer 14 to the organic light emitting layer 16 is not formed. In addition, in order that an electrical charge which can not contribute to light emitting is trapped in the organic light emitting layer 16, it is preferable that a material having a band gap of 3.0 eV or more is adopted. More preferably, a material having a band gap of 3.5 eV or more is adopted.

The following methods can be used depending on material for a formation method of an interlayer 15: a dry method such as resistance heating evaporation method, electron-beam evaporation technique, reactivity evaporation method, ion plating method and sputtering method; and a wet method such as ink-jet printing, relief printing, gravure process and screen printing. In addition, a formation method of a reflection layer is not limited to the above methods, and other methods can be used.

In addition, in the light emitting layer 16, an electron and a hole are recombined, the electron and the hole being injected by applying a voltage between the first electrode 12 and the second electrode 17. When this recombination occurs, light is emitted. The emitted light passes through a transparent electrode and is extracted to the exterior of an organic EL element. In the case where light emitting layers formed on respective adjacent pixels are different, for example, in the case of a display device of a full-color display of RGB, respective light emitting layers 16R, 16G, 16B are formed on respective light emitting pixel parts (pixel regions) of the first electrode 12 by a method for forming a pattern.

Examples of materials for the light emitting layer 16 are as follows. A light emitting color material such as coumarin system, perylene system, pyran system, anthrone system, porphyrin system, quinacridone system, N,N'-dialkyl-substituted quinacridone system, naphthalimide system and N,N'-diaryl-substituted pyrrolopyrrole system are dispersed in polymers such as polystyrene, polymethyl methacrylate and polyvinyl carbazole. In addition, as a material of the light emitting layer 16, a high molecular light emitting material such as dendrimer material, PPV system, PAF system and polyparaphenylene can be used. In addition, a material of the light emitting layer 16 is preferably soluble in water or a solvent.

These materials of a light emitting layer are dissolved in a solvent or are stably dispersed in a solvent, and this is used as an organic light emitting ink (a liquid material of a light emitting layer). A solvent which dissolves or disperses an organic light emitting material is toluene, xylene, acetone, anisole, methyl ethyl ketone, methyl isobutyl ketone and cyclohexanone (a single solvent or a mixed solvent). Above all, aromatic organic solvents such as toluene, xylene and anisole are preferably used in view of solubility of an organic light emitting material. In addition, a surfactant, an antioxidant, a viscosity modifier and an ultraviolet absorber can be added to an organic light emitting ink, if necessary.

In addition to the above high molecular materials, the following low molecular light emitting materials can be used: 9,10-diaryl anthracenes; pyrene; coronene; perylene; rubrene; 1,1,4,4-tetra phenylbutadiene; tris(8-quinolate)aluminium complex; tris(4-methyl-8-quinolate)aluminium complex; bis(8-quinolate)zinc complex; tris(4-methyl-5-trifluoromethyl-8-quinolate)aluminium complex; tris(4-methyl-5-cyano-8-quinolate)aluminium complex; bis(2-methyl-5-trifluoromethyl-8-quinolinolate)[4-(4-cyano phenyl)phenolate]aluminium complex; bis(2-methyl-5-cyano-8-quinolinolate) [4-(4-cyano phenyl)phenolate]aluminium complex; tris(8-quinolinolate)scandium complex; bis[8-(para-tosyl)aminoquinoline]zinc complex and cadmium complex; 1,2,3,4-tetraphenylcyclopentadiene; and poly-2,5-diheptyl oxy-para-phenylenevinylene.

In the case where a material of respective light emitting layers 16 is a low molecular light emitting material, the light emitting layer 16 can be formed mainly by a dry process such as evaporation method. In the case where a material of respective light emitting layers 16 is a high molecular light emitting material or a material in which a low molecular light emitting material is dispersed in a high molecular material, the light emitting layer 16 can be formed by a printing method such as a screen printing method or an ink jet method. In the case where the light emitting layer 16 is formed by a printing method, an ink in which the light emitting material is dissolved in an organic solvent, water or a mixed solvent thereof can be used.

An electron injection layer is a layer having a function in which an electron is transported from a cathode. The electron transport layer is a layer having a function in which an electron is transported into a light emitting layer. These layers may have both an electron transport function and an electron injection function. In this case, according to the levels of these functions, a function layer is called one of the names or both of the names. A material of such an electron injection layer or an electron transport layer is, for example, nitro-substituted fluorene such as 1,2,4-triazoles (TAZ) and diphenyl KISON derivative.

Next, the second electrode (a counter electrode) 17 related to the present invention is formed on the light emitting medium layer 19. In an organic EL display device of an active matrix driving type, a second electrode is formed on the entire surface of a display region. The second electrode 17 can include a metal such as Mg, Al and Yb. In addition, the following layer stack may be put in a boundary surface of the organic light emitting medium layer 19. The layer stack is a stack with a chemical compound of about 1 nm thicknesses such as Li, oxidation Li and LiF, and Al and Cu having stability and high conductivity. In addition, stability should be balanced with electron injection efficiency. Therefore an alloy system may be used. An alloy of one or more kinds of metal such as Li, Mg, Ca, Sr, La, Ce, Er, Eu, Sc, Y, and Yb that have a low work function, and a metallic element such as Ag, Al, and Cu which are stable can be used. In particular, alloys such as MgAg, AlLi, and CuLi can be used. In addition, a transparent conductive film made of a metal composite oxide such as ITO (indium tin composite oxide), IZO (indium zinc composite oxide) and AZO (zinc aluminium composite oxide) can be used.

In an organic EL display device having a top emission structure, light emitted from the light emitting medium layer 19 passes through the second electrode 17. Therefore, the second electrode 17 has to be translucent in a visible light wave length region. Therefore, a film thickness of a transparent conductive film is preferably adjusted so that average optical transparency in a visible light wave length region is 85% or more. In the case where a single metal substance such as Mg, Al or Yb is used for a material of the second electrode 17, a film thickness thereof is preferably 20 nm or less, and more preferably 2-7 nm. In the case of a metal film, a film thickness thereof is preferably adjusted so that average optical transparency in a visible light wave length region is 70% or more.

The following methods can be used depending on material for a formation method of the second electrode 17: a dry method such as resistance heating evaporation method, electron-beam evaporation technique, reactivity evaporation method, ion plating method and sputtering method; and a wet method such as ink-jet printing, gravure process and screen printing. In addition, a formation method of a reflection layer is not limited to the above methods, and other methods can be used.

For example, a sealing body 28 is arranged on the substrate 11 with the first electrode 12, the partition wall 23, the light emitting medium layer 19 and the second electrode 17. In particular, the sealing body 28 is attached to the substrate 11 at a peripheral part of the substrate 11 and thereby the substrate 11 is sealed by the sealing body 28. In an organic EL display device having a top emission structure, light emitted from a light emitting medium layer passes through the sealing body 28 which is located at an opposite position to the substrate 11 and thereby light is extracted to the exterior of an organic EL display device. Therefore, high optical transparency in a visible light wave length region is required. It is preferable that average optical transparency in a visible light wave length region is 85% or more.

A structure of the sealing body 28 in the case where a sealing cap such as a glass cap with a concave part or a metal cap is used is explained. In this case, a peripheral part of the substrate 11 is attached to a peripheral part of the sealing cap 26 so that the first electrode 12, the partition wall 23, the light emitting medium layer 19, and the second electrode 17 are arranged in a space inside the sealing cap 26. A space between the sealing cap 26 and the substrate 11 is sealed. The sealing cap 26 is attached to the substrate 11 using an adhesive. In addition, desiccant is formed in the concave part, and the concave is filled with an inert gas such as nitrogen.

In addition, a sealing structure using a sealing plate 29 and a resin layer 21 may be adopted. In this case, the resin layer 21 is formed between the sealing plate 29 and the substrate 11 with the first electrode 12, the partition wall 23, the light emitting medium layer 19 and the second electrode 17. A method for forming this structure is as follows. The resin layer 21 is formed on the sealing plate 29. While the resin layer 21 faces the substrate 11, the sealing plate 29 is attached to the substrate 11. Thereby, degradation of an organic EL element can be prevented, the degradation being due to moisture, gas or the like which enters the concave.

A substrate having low permeability of moisture or oxygen is used as a material of the sealing plate 29. Examples of the material include ceramics such as alumina, silicon nitride, boron nitride, glass such as alkali-free glass and alkali glass, quartz and film having moisture resistance. Examples of a film having a moisture resistance are as follows. A film in which SiOx is deposited on both sides of a plastic substrate by a CVD method, a film having low optical transparency, a film having a water absorbing property or a polymerized film to which a water absorbing agent is applied. It is preferable that moisture permeability of a film having moisture resistance is equal to or less than $1 \times 16$ g/m$^2$/day.

For example, the following material can be used for the resin layer 21: A photo-curing adhesive property resin, a heat curing adhesive property resin and two fluid hardening adhesive property resins including an epoxy type resin, acrylic resin, silicone oil or the like, acrylic resin such as ethylene ethylacrylate (EEA) polymer, vinyl resins such as ethylene vinyl acetate (EVA), thermoplastic resin such as polyamide, synthetic rubber, and thermoplasticity adhesive property resins such as acid denatured substances of polyethylene or polypropylene. An example of a method for forming the resin layer 21 on the sealing plate 29 is shown below: solvent solution method, pushing out laminate method, fusion/hot melt method, calender method, discharge jet application method, screen printing, vacuum laminate method and heated roll laminate method. A material having hygroscopicity and a property to absorb oxygen can be incorporated into the resin layer 21 if necessary. The thickness of the resin layer 21 formed on the sealing plate 29 is determined by the size and configuration of a sealed organic EL element. About 5-500 μm is desirable for the thickness of a resin layer.

A process in which the sealing body 28 is attached to the substrate 11 with the first electrode 12, the partition wall 23, the light emitting medium layer 19 and the second electrode 17 is preferably performed under an inert gas atmosphere or under vacuum. In the case where a structure of the sealing body 28 having a two layer structure comprised of the sealing plate 29 and the resin layer 21 is adopted and a material of the resin layer 21 is a thermoplastic resin, pressure bonding between the sealing body 28 and the substrate 11 is preferably performed using a heated roll. On the other hand, in the case where a heat curable adhesive resin is used as a material of the resin layer 21, after pressure bonding between the sealing body 28 and the substrate 11 is performed using a heated roll, additional heat curing at a curing temperature is preferably performed. Further, in the case where a photo curable adhesive resin is used as a material of the resin layer 21, after pressure bonding between the sealing body 28 and the substrate 11 is performed using a roll, the photo curable adhesive resin is further irradiated with light and thereby the resin can be cured. In addition, in the above method, the resin layer 21 is formed on the sealing plate 29. However, it is possible that the resin layer 21 is formed on the substrate 11 and the sealing plate 29 is attached to the substrate 11.

As a pre-process before an organic EL element on the substrate 11 is sealed using the sealing plate 29, or, instead of the above sealing process, a sealing body 28 made of a passivation film may be formed. In this case, the passivation film made of an inorganic thin film such as a silicon nitride film is formed by a dry process such as an EB evaporation method or a CVD method. In addition, a combined structure including the passivation film and the above sealing structure can be adopted. A film thickness of the passivation film is, for example, 100-500 nm. A suitable film thickness changes according to moisture permeability, optical transparency or the like. However, the suitable film thickness is 150-300 nm. In a structure of a top emission type, it is necessary that a kind of material in a sealing structure is selected and a film thickness is adjusted, considering optical transparency in addition to the above characteristics. In a visible light wavelength region, the entire average of optical transparency is preferably equal to or more than 70%.

In addition, the technological scope of the present invention is not limited to the above embodiments and can be variously changed within the subject of the present invention.

In the first embodiment of the present invention, a first partition wall has an inverse tapered shape, and a second electrode having a bottom narrower than a top part of the first partition wall is formed. Thereby, if a light emitting medium layer is formed on the entire surface of a display region by any of a dry film formation method and a wet film formation method, a display failure due to a leak current does not occur and an EL display apparatus having excellent EL characteristics can be manufactured.

In the present invention, "an inverse tapered" means a structure in which a side surface part is at least partially narrower than a top part of a partition wall, the top part being parallel to a horizontal surface of a substrate. For example, FIG. 5A shows an example of an inverse tapered shape. In FIG. 5A, the top part is widest, and the width becomes gradually narrower from the top part to the bottom part. In FIG. 5B, a part between the top part and the bottom part is partially narrower than the top part. In addition, as shown in FIG. 5C, a concave and a convex may be formed on a side surface part. As long as a partition wall has a side part narrower than the top part, the bottom part may be wider than the top part as shown in FIG. 5D. An optimum film thickness of the first partition wall having an inverse tapered shape changes depending on the kind of material used for the partition wall, a film thickness of a second partition wall and a film thickness of a light emitting medium layer. However, the optimum film thickness is 50 nm-1000 nm. In the case where a film thickness is less than 50 nm, the first partition wall is thinner than the light emitting medium layer and the first partition wall itself is covered by the light emitting layer. Thereby, a leak current easily flows. In the case where a film thickness is more than 1000 nm, a counter electrode of a first electrode is easily broken.

In addition, in the case where a silicon system material is adopted as a material of the first partition wall and a single layer, stacked layers and a mixed layer made of the material are formed, an insulating property which is required for the partition wall of an organic EL element can be obtained.

An optimum film thickness of a second partition wall having a tapered shape changes depending on the kind of a material used for the partition wall, a film thickness of the first partition wall and a film thickness of the light emitting medium layer. However, the optimum film thickness is 500 nm-5000 nm. In the case where a film thickness is less than 500 nm, an insulating property necessary for the partition wall can not be obtained. In the case where a film thickness is more than 5000 nm, a counter electrode of a first electrode is easily broken.

In addition, in the case where a light sensitive material is adopted as the material of the first partition wall and a pattern is formed by a photolithography method, the bottom part narrower than the top part of the first partition wall can be easily obtained.

In the case where an inorganic compound including one or more kinds of transition metals is adopted as a material of a hole transport layer, oxide, sulfide or nitride is adopted as an inorganic compound, and a single layer, stacked layers and a mixed layer made of these materials is formed, and a work function required for a material of the hole transport material of an organic EL element can be obtained.

EXAMPLES

Next, examples of the organic EL display device of the present invention are explained. In addition, the present invention is not limited to following examples. First, examples of an organic EL display element of the first embodiment are explained referring to Examples 1, 2 and Comparative Example 1.

Example 1

Firstly, a glass substrate (a transparent substrate) of which a diagonal size of 2.2 inches was prepared. A thin film of ITO (indium-tin oxide) was formed on the entire surface of the substrate. Next, a pattern of the ITO thin film was formed by a photolithography method and etching using an acid solution. Thereby, pixel electrodes having a plurality of line patterns were formed. The plurality of line patterns were as follows. A width of the line was 136 μm. A space between adjacent lines was 30 μm. 192 ITO lines were formed on the glass substrate of which a side length was about 40 mm.

Next, a first partition wall 23A was formed as follows. A film of SiN was formed on the entire surface of the substrate by a CVD method. Gases of $SiH_4$, $NH_3$ and $H_2$ of which purities were 99.9999% were used for the CVD method. The substrate inside a chamber was heated by a hot plate so that a surface of the substrate became 130 degrees Celsius. A film of 600 nm film thickness was obtained by film formation under a condition of 1.5 kW plasma power for 200 seconds. At this time, $SiH_4$, $NH_3$ and $H_2$ (ratio is 1:2:10) are supplied so that the degree of vacuum was 150 Pa. The formed SiN film had a concave and a convex due to a step between the ITO and a surface of the substrate. Therefore, a surface of the SiN film was polished and thereby a flattening process was performed to 500 nm from a surface of the substrate.

A positive type photosensitive resist (ZEP520A, a product of ZEON CORPORATION) was applied to the entire surface of the flattened first partition wall by spin coating. A condition of the spin coating is as follows. Rotation (4000 rpm) was performed for 50 seconds. Thereafter, the resist was baked at 180 degrees Celsius for 5 minutes by a hot plate and thereby a thin film was formed. After a resist film was formed, the resist film except for a part corresponding to a first partition wall was exposed, and development and washing were performed. Thereby a resist pattern was formed.

After the resist pattern was formed, an inverse tapered shape of the first partition wall was formed by a reactive ion etching. Fluorine and oxygen were used as a reactive gas. A mixed gas including a fluorine gas and an oxygen gas was introduced inside the chamber. Respective flow rates were adjusted, thereby a flow rate of fluorine gas was 100 sccm and a flow rate of oxygen gas was 400 sccm. Pressure inside the chamber was adjusted to 10 Pa. In addition, 700 W of a high frequency power (13.56 MHz) was applied. The silicon nitride film except for a partition wall was removed by dry etching. A taper angle was 150 degrees. A first partition wall 23A having an inverse tapered shape in which a top part was 30 μm and a bottom part was 27 μm was formed. After the dry etching, the resist was peeled.

Next, a second partition wall 23B was formed as follows. A positive type photosensitive polyimide (Photoneece DL-1000, a product of Toray Industries, Inc.) was applied to the entire surface of the substrate so as to cover the first partition wall 23A by spin coating. A condition of spin coating was as follows. The glass substrate was rotated (110 rpm) for 5 seconds. Thereafter, the glass substrate was rotated (300 rpm) for 20 seconds. A film thickness of the positive type photosensitive polyimide was 1.8 μm. A photo mask in which only a part above the first partition wall 23A was shielded was prepared. The applied photosensitive material except for a part of the first partition wall 23A was exposed (200 mJ/cm$^2$) by an i-line stepper using a photolithography method. After the exposure, development was performed. Baking was performed under a condition of 230 degrees Celsius for 30 minutes using an oven. Thereby, a second partition wall 23B was formed on the first partition wall 23A. The second partition wall 23A formed in this way had a taper angle of 50 degrees. A top part was 15 μm, a bottom part was 25 μm and a film thickness was 1.5 μm.

Next, the ITO was subjected to surface processing by UV irradiation. The glass substrate with the partition wall was irradiated with a UV light for 3 minutes using a UV/O$_3$ washing apparatus. The work function of the ITO before UV irradiation was 4.8 eV and the work function of the ITO before UV irradiation was 5.3 eV.

Next, a hole transport layer 14 was formed. Molybdenum oxide was used as an inorganic material of the hole transport layer 14. A film of the inorganic material of 20 nm film thickness was formed by sputtering method so as to cover the entire surface of a display region. In the sputtering method, molybdenum metal target of 99.9% purity was used, argon of an inert gas and oxygen of a reactive gas were supplied inside a chamber of a sputtering apparatus. In addition, a film of molybdenum oxide was formed on an active matrix substrate 101 by a reactive DC magnetron sputtering method. Power density of the target was 1.3 W/cm$^2$. A ratio of a mixed gas supplied inside the chamber was 2 (argon): 1 (oxygen). An exhaust valve in the chamber was adjusted and the amount of a gas supplied to the chamber was controlled so that the degree of vacuum at the time of sputtering became 0.3 Pa. A film thickness of molybdenum oxide was controlled by adjusting the time for sputtering. In a process for forming a pattern, a metal mask having an aperture of 33 mm×33 mm was used.

A film of molybdenum oxide was uniformly formed at a light emitting pixel part. In addition, a film of molybdenum oxide formed on the partition wall was broken by the inverse tapered shape formed on the first partition wall 23A. Therefore, a non-continuous film of molybdenum oxide was formed on the partition wall.

Next, polyphenylene vinylene derivative was adopted as an organic light emitting material. An organic light emitting ink in which 1% of the material was dissolved in toluene was prepared. A light emitting layer was printed by a relief printing method on a pixel electrode between partition walls so that the light emitting layer corresponds to a line pattern of the pixel electrode. A film thickness of the dried light emitting layer after the printing process was 100 nm.

Next, a line pattern of a cathode made of Ca and Al was formed on the light emitting layer. Specifically, the cathode layer was formed by a mask evaporation using a resistance heating evaporation method so that a line pattern of the cathode was perpendicular to a line pattern of the pixel electrode. Finally, the organic EL structure body formed in this way was sealed using a glass cap and an adhesive in order to be protected from outside oxygen or moisture. Thereby, an organic EL display device was manufactured.

A taking-out electrode of an anode side which was connected to each pixel electrode and a taking-out electrode of a cathode side which was connected to a cathode layer were arranged in a peripheral part of a display region of an organic EL display device obtained in this way. These taking-out electrodes were connected to a power source and light was emitted from the organic EL display element. A lighting state and a display state were confirmed.

The organic EL display device obtained in this way was driven. Then, a brightness of 750 cd/cm$^2$ was obtained in the case of a driving voltage of 7V. Cross talk due to a leak current was not observed.

Comparative Example 1

Firstly, as Example 1, a glass substrate was prepared and a pixel electrode was formed.

Next, in Comparative Example 1, a first partition wall 23A having an inverse tapered shape was not formed, and a positive type photosensitive polyimide (Photoneece DL-1000, a product of Toray Industries, Inc.) was applied to the entire surface of the substrate by spin coating. A condition of the spin coating was as follows. The glass substrate was rotated (110 rpm) for 5 seconds. Thereafter, the glass substrate was rotated (250 rpm) for 20 seconds. A film thickness of a positive type photosensitive polyimide was 2.0 μm. The same as the second partition wall 23B of Example 1, exposure and development were performed and thereby partition wall 23 was obtained. A partition wall formed in this way included a taper angle (an angle between a surface of the substrate and a side surface of the partition wall) of 45 degrees. A top part was 15 μm, a bottom part was 35 μm and a film thickness was 1.7 μm.

Next, as Example 1, surface processing of ITO was performed, and a hole transport layer, a light emitting layer and a cathode layer were formed. When an organic EL display element obtained in this way was driven, a brightness of 300 cd/cm$^2$ was obtained in the case of a driving voltage of 7 V. Cross talk due to a leak current occurred.

In addition, a method for evaluating cross talk in the Examples and Comparative Examples was to observe whether a region except for a light emitting pixel part emits light or not. In addition, a method for measuring brightness in the Examples and Comparative Examples was to measure brightness of focused light only from a pixel part. It was clear from the evaluation result of Comparative Example 1 that leak current was generated, cross talk occurred and brightness of emitted light was reduced since the partition wall did not have an inverse tapered shape. On the other hand, in Example 1 of the present invention, the partition wall had a two layer structure, and the first partition wall had an inverse tapered shape. Next, a hole transport layer was formed on the partition wall. Here, a hole transport layer was broken due to an inverse tapered shape of the first partition wall. Therefore, leak current was reduced or controlled, cross talk did not occur and an organic EL display element having a high intensity of emitting light was obtained.

Next, an example of an organic EL display device of the second embodiment which was an active matrix driving type organic EL display device shown in FIG. 9 was explained referring to Example 2 and Comparative Example 2.

Example 2

Firstly, an active matrix substrate 101 was prepared. In this active matrix substrate 101, an ITO thin film was formed as a first electrode (a pixel electrode) 102. The ITO thin film was connected to a TFT inside a substrate. A diagonal size of the substrate was 6 inches. The number of pixels was 320×240.

Next, partition wall 203 was formed so as to cover an end part of the first electrode 102 on the substrate 101 and so as to section each of a plurality of pixels. As in Example 1, two layers including a first partition wall 203A and a second partition wall 203B were formed. This partition wall 203 (the first partition wall 203A and the second partition wall 203B) sections a pixel region having an area of 0.12 mm×0.36 wherein the number of sub pixels was 960×240 dots.

As in Example 1, an active matrix substrate 101 with a partition wall 203 was subjected to UV/O3 washing.

As in Example 1, a hole transport layer 104 was formed on the active matrix substrate 101 which was subjected to UV/O$_3$ washing. A film thickness of molybdenum oxide was 30 nm. A pattern was formed using a metal mask having an opening of 116 mm×87 mm so as to cover the entire surface of a display region on the active matrix substrate.

Figure 8:
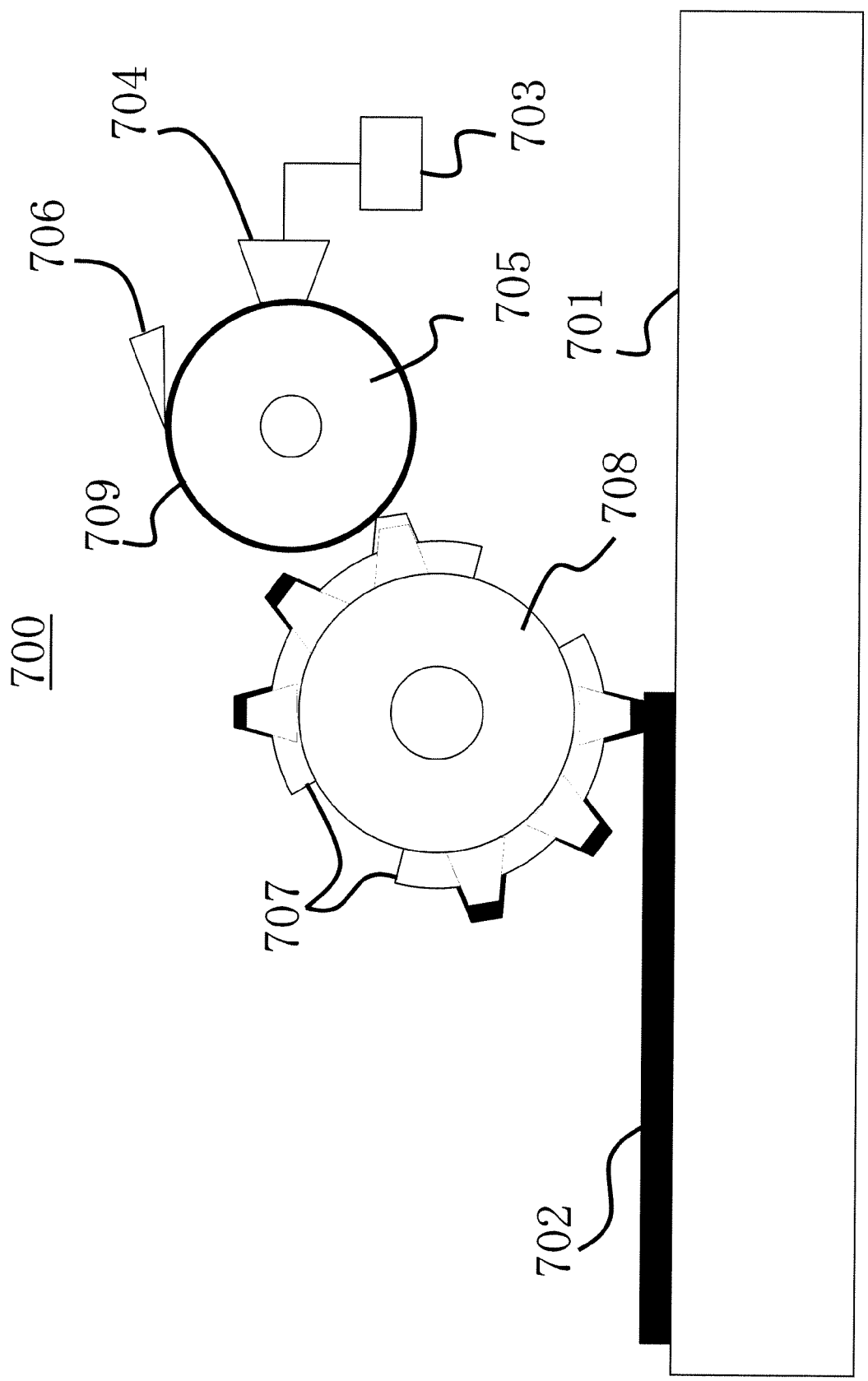
FIG. 8 is a schematic cross sectional diagram of a relief printing machine related to the present invention.

Next, polyvinyl carbazole derivative was adopted as a material of an interlayer 105. The material was dissolved in toluene so that the concentration of the material became 0.5%. Thereby, an ink of a material of the interlayer 105 was obtained. Next, the substrate 101 with the pixel electrode 102, the partition wall 203 and the hole transport layer 104 was arranged on a relief printing machine 700 shown in FIG. 8 as a substrate to be printed 702. A relief printing apparatus 700 includes an anilox roll 705, a doctor 706, a relief printing plate 707 made of a photosensitive resin and a plate cylinder 708. An ink layer 709 was applied to a surface of an anilox roll 705. The pixel electrode 102 surrounded by the partition wall 203 was formed on the substrate to be printed 702. The hole transport layer 204 was formed on the pixel electrode 102. The interlayer 105 was printed on the hole transport layer 204 by a relief printing method using the ink so that the interlayer 105 corresponds to the line pattern of the pixel electrode. In the relief printing method, the anilox roll of 300 lines/inch and the relief printing plate 707 were used. A film thickness of the interlayer 105 after the ink was dried was 20 nm.

Next, a polyphenylene vinylene derivative was adopted as an organic light emitting material of an organic light emitting layer 106. The material was dissolved in toluene so that the concentration of the material became 1%. In this way, an organic light emitting ink of a material of the organic light emitting layer 106 was obtained. Next, the substrate 101 with the pixel electrode 102, the partition wall 203, the hole transport layer 104 and the interlayer 105 was arranged on the relief printing apparatus 700 shown in FIG. 8 as the substrate to be printed 702. The interlayer 205 surrounded by the partition wall 203 was formed on the substrate to be printed 702. The organic light emitting layer 106 was printed on the interlayer 205 by a relief printing method using the organic light emitting ink so that the organic light emitting layer 106 corresponds to the line pattern of the interlayer 205. In the relief printing method, an anilox roll 705 of 150 lines/inch and a relief printing plate 707 made of a photosensitive resin were used. The ink was printed. After the ink was dried, a film thickness of the organic light emitting layer 106 was 80 nm.

A Ca film of 5 nm thickness was formed on the organic light emitting layer 106 by a vacuum vaporization method as a second electrode (a counter electrode) 107. In the process for forming the Ca film, a metal mask having an opening of 116 mm×87 mm was used. Thereafter, an Al film of 200 nm thickness was formed on the Ca film by a vacuum vaporization method. In the process for forming the Al film, a metal mask having an opening of 120 mm×90 mm was used.

Thereafter, a glass substrate with a concave part at a center part of the glass substrate was prepared as a sealing body 208. The sealing body 208 was connected to the active matrix substrate 101 so that the second electrode (a cathode) 107 was arranged inside the concave part of the sealing body 208. In addition, desiccant was arranged in the concave part of the glass substrate (the sealing body 208) in order to prevent degradation due to moisture or oxygen entering the substrate.

When the organic EL display panel obtained in this way was driven, a brightness of 700 cd/cm$^2$ was obtained in the case of a driving voltage of 7 V. Cross talk due to leak current did not occur.

Comparative Example 2

Firstly, as Example 2, an active matrix substrate was prepared. Next, as Comparative Example 1, a partition wall 203 was formed. A film forming process of a light emitting medium layer and a sealing process were performed as in Example 2.

When the organic EL display device obtained in this way in Comparative Example 2 was driven, non-uniformity of brightness between pixels was observed. Leak current was not reduced or controlled and it was thought that this was because current flowing between pixels was not uniform.

INDUSTRIAL APPLICABILITY

As mentioned above, the present invention is useful for an organic EL display device and a method for manufacturing the device in which leak current can be reduced or controlled, in an organic EL display device in which a predetermined light emitting medium layer was formed on the entire display region including a part of a partition wall sectioning a pixel. In addition, the present invention is useful for an organic EL element, an image display device and a method for manufacturing an image display device in which leak current is reduced and the element's property is improved.

What is claimed is:

1. An organic EL element, comprising:
   a substrate;
   a first electrode having a pixel region, the first electrode formed on the substrate;
   a multi-step partition wall,
     which includes a first partition wall formed on the substrate, the first partition wall sectioning the first electrode and having an inverse tapered shape, and
     a second partition wall formed on the first partition wall, the second partition wall having a bottom part which is narrower than a top part of the first partition wall;
   a light emitting medium layer,
     which includes a first light emitting medium layer formed on the pixel region, the first partition wall and the second partition wall, the first light emitting medium layer made of an inorganic material, and
     an organic light emitting layer on the first light emitting medium layer; and
   a second electrode formed on the light emitting medium layer; wherein
   the first light emitting medium layer is formed on the first electrode and the multi-step partition wall.

2. The organic EL element according to claim 1, wherein the first partition wall is made of an inorganic insulating material.

3. The organic EL element according to claim 2, wherein a film thickness of the first partition wall is 50 nm-1000 nm.

4. The organic EL element according to claim 1, wherein the second partition wall is made of a light sensitive material.

5. The organic EL element according to claim 1, further comprising:
   a second light emitting medium layer made of an organic material, the second light emitting medium layer arranged between the first light emitting medium layer and the second electrode and covering the light emitting medium layer and the multi-step partition wall on the first electrode.

6. The organic EL element according to claim 1, wherein a total film thickness of the first partition wall and the second partition wall is 550 nm-5000 nm.

7. The organic EL element according to claim 1, wherein a thickness of the light emitting medium layer is smaller than a total film thickness of the first partition wall and the second partition wall.

8. The organic EL element according to claim 1, wherein the first electrode is a transparent electrode, and wherein the light emitting medium layer is formed between the first electrode and the second electrode.

9. The organic EL element according to claim 1, wherein the second electrode is a transparent electrode, and wherein the light emitting medium layer is formed between the first electrode and the second electrode.

10. An image display device comprising a display element of the organic EL element according to claim 1.

11. A method for manufacturing an organic EL element, the method comprising:
    preparing a substrate;
    forming a first electrode on the substrate;
    forming a first partition wall having an inverse tapered shape, the first partition wall made of a silicon system insulating material and sectioning the first electrode;
    forming a second partition wall made of a light sensitive material, the second partition wall having a bottom part which is narrower than a top part of the first partition wall;

forming a light emitting medium layer including a hole transport layer and an organic light emitting layer, the hole transport layer made of an inorganic material and formed on a region of the first electrode, the first partition wall and the second partition wall; and forming a second electrode facing the first electrode.

12. The method for manufacturing an organic EL element according to claim 11, wherein a film thickness of the first partition wall is 50 nm-1000 nm.

13. The method for manufacturing an organic EL element according to claim 11, wherein a film thickness of the second partition wall is 500 nm-5000 nm.

14. The method for manufacturing an organic EL element according to claim 11, wherein at least one layer of the light emitting medium layer is formed by a wet type film forming method.

15. The method for manufacturing an organic EL element according to claim 14, wherein at least one layer of the light emitting medium layer is formed by a printing method.

16. The method for manufacturing an organic EL element according to claim 11, wherein the first electrode is a transparent electrode, and wherein the light emitting medium layer is formed between the first electrode and the second electrode.

17. The method for manufacturing an organic EL element according to claim 11, wherein the second electrode is a transparent electrode and wherein the light emitting medium layer is formed between the first electrode and the second electrode.

18. A method for manufacturing an image display device, the method comprising:

forming a display element by the method for manufacturing an organic EL element according to claim 11.

* * * * *